(12) United States Patent
Lee et al.

(10) Patent No.: US 7,960,806 B2
(45) Date of Patent: Jun. 14, 2011

(54) SUB-MOUNT, LIGHT EMITTING DIODE PACKAGE AND MANUFACTURING METHOD THEREOF

(75) Inventors: Young-Ki Lee, Hwaseong-si (KR); Seog-Moon Choi, Seoul (KR); Hyung-Jin Jeon, Gunpo-si (KR); Sang-Hyun Shin, Hwaseong-si (KR)

(73) Assignee: Samsung LED Co., Ltd., Suwon (KR)

( * ) Notice: Subject to any disclaimer, the term of this patent is extended or adjusted under 35 U.S.C. 154(b) by 0 days.

(21) Appl. No.: 12/285,324

(22) Filed: Oct. 1, 2008

(65) Prior Publication Data

US 2009/0261356 A1  Oct. 22, 2009

(30) Foreign Application Priority Data

Apr. 17, 2008 (KR) ........................ 10-2008-0035521

(51) Int. Cl.
*H01L 27/14* (2006.01)
(52) U.S. Cl. . 257/431; 257/433; 257/446; 257/E25.032; 349/58; 349/138
(58) Field of Classification Search .................. 257/431, 257/433, 446, E25.032; 349/58, 138
See application file for complete search history.

(56) References Cited

U.S. PATENT DOCUMENTS

| 6,936,855 | B1 * | 8/2005 | Harrah .............................. 257/88 |
| 7,723,730 | B2 * | 5/2010 | Groetsch et al. ................. 257/79 |
| 2004/0222433 | A1 * | 11/2004 | Mazzochette et al. .......... 257/99 |
| 2006/0284190 | A1 * | 12/2006 | Zimmerman et al. .......... 257/79 |
| 2008/0099770 | A1 * | 5/2008 | Mendendorp et al. .......... 257/79 |
| 2010/0071936 | A1 * | 3/2010 | Tan ................................ 174/252 |

FOREIGN PATENT DOCUMENTS

| JP | 1987-226645 | 10/1987 |
| KR | 2006-087620 | 8/2006 |

OTHER PUBLICATIONS

Korean Office Action dated Dec. 7, 2009 and issued in corresponding Korean Patent Application No. 10-2008-0035521.

* cited by examiner

*Primary Examiner* — Michelle Estrada

(57) ABSTRACT

A sub-mount, a light emitting diode package, and a method of manufacturing thereof are disclosed. A sub-mount, on which multiple light emitting diodes are mounted, can include a multiple number of metal bodies on which the light emitting diodes are respectively mounted, and an oxide wall interposed between the metal bodies such that the adjacent metal bodies are supported by each other but electrically disconnected from each other. By utilizing certain embodiments of the invention, a high heat releasing effect may be obtained, and manufacturing costs may be reduced.

7 Claims, 10 Drawing Sheets

SUB-MOUNT, LIGHT EMITTING DIODE PACKAGE AND MANUFACTURING METHOD THEREOF

CROSS-REFERENCE TO RELATED APPLICATIONS

This application claims the benefit of Korean Patent Application No. 10-2008-0035521 filed with the Korean Intellectual Property Office on Apr. 17, 2008, the disclosure of which is incorporated herein by reference in its entirety.

BACKGROUND

1. Technical Field

The present invention relates to a sub-mount, a light emitting diode package, and a method of manufacturing the same.

2. Description of the Related Art

A light emitting diode, or an LED, is a semiconductor device that generates light of a variety of colors when an electric current is applied. The color of the light generated by the LED mainly depends on the chemical components forming the semiconductor of the LED. Compared to light sources based on filaments, the LED may provide several advantages, including a longer life span, lower power consumption, superior initial operation characteristics, higher vibration resistance, and higher tolerance to repeated power disconnections, and thus the demands for the LED are continuously increasing.

A conventional LED had a power level of less than 1 W. As such, the LED was employed for low-power applications, such as in BLU's (backlight units). However, the demands for LED's in high-power applications (e.g. lighting devices, headlamps in vehicles, street lights, etc.) have grown, and accordingly, much attention has been focused on increasing the efficiency and life span of LED's. As a result, the development of a high-power light emitting diode (LED) package is growing in importance. In this type of high-power light emitting diode package, the high-intensity output provided by the package may entail a need for superior heat releasing performance.

SUMMARY

An aspect of the invention is to provide a sub-mount, an LED package equipped with the sub-mount, and a method for manufacturing the LED package, that provide superb heat releasing properties.

One aspect of the invention provides a sub-mount on which multiple light emitting diodes are mounted. The sub-mount can include a multiple number of metal bodies on which the light emitting diodes are respectively mounted, and an oxide wall interposed between the metal bodies such that the adjacent metal bodies are supported by each other but electrically disconnected from each other.

The metal body can be made from a material containing aluminum, while the oxide wall can be made from a material containing aluminum oxide.

An oxide layer can be formed on a lower surface of the multiple number of metal bodies and the oxide wall.

Another aspect of the invention provides a light emitting diode package that includes a multiple number of light emitting diodes. The light emitting diode package can include a substrate in which a cavity is formed, a sub-mount inset in the cavity, and multiple light emitting diodes mounted on the sub-mount. Here, the sub-mount can include a multiple number of metal bodies on which the light emitting diodes are respectively mounted, and an oxide wall interposed between the metal bodies such that the adjacent metal bodies are supported by each other but electrically disconnected from each other.

The metal body can be made from a material containing aluminum, while the oxide wall can be made from a material containing aluminum oxide. Also, an oxide layer can be formed on a lower surface of the multiple number of metal bodies and the oxide wall.

The light emitting diodes may be arranged such that a cathode or an anode of a light emitting diode is in contact with the metal body.

Yet another aspect of the invention provides a method of manufacturing a light emitting diode package that includes a multiple number of light emitting diodes. The method can include: forming a sub-mount, which includes multiple metal bodies electrically disconnected by at least one oxide wall, by selectively oxidizing a metal plate; mounting the light emitting diodes on the metal bodies respectively; and mounting the sub-mount in a substrate, in which a cavity is formed.

The metal plate can be made from a material containing aluminum, and the light emitting diodes can be mounted such that one of the cathode and the anode of a light emitting diode is in contact with the metal body.

An operation of forming an oxide layer by oxidizing a lower surface of the metal plate may additionally be performed.

Additional aspects and advantages of the present invention will be set forth in part in the description which follows, and in part will be obvious from the description, or may be learned by practice of the invention.

DETAILED DESCRIPTION

Figure 1:
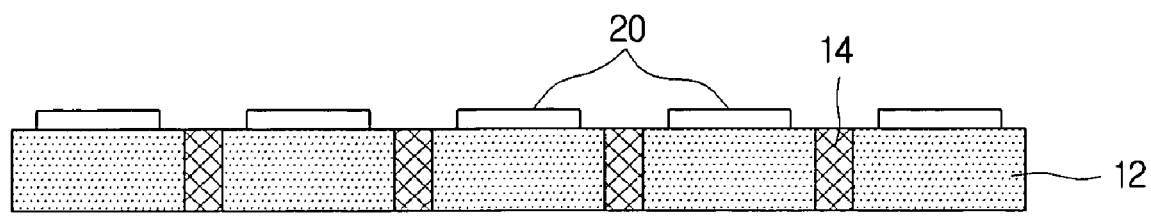
FIG. 1 is a cross sectional view illustrating a first disclosed embodiment of a sub-mount according to one aspect of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The sub-mount, light emitting diode package, and method of manufacturing thereof, according to certain embodiments of the invention will be described below in more detail with reference to the accompanying drawings. Those components that are the same or are in correspondence are rendered the same reference numeral regardless of the figure number, and redundant explanations are omitted.

Figure 2:
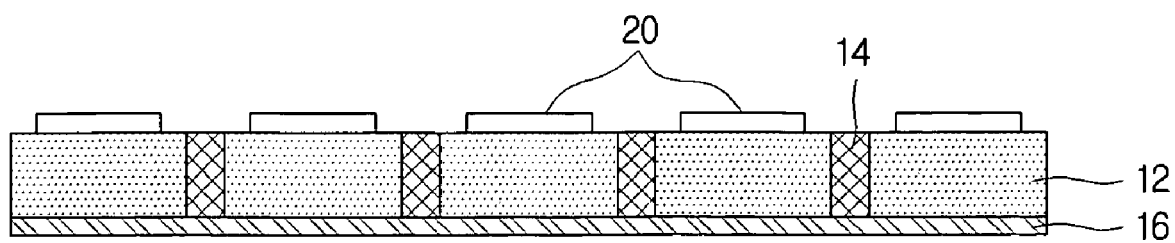
FIG. 2 is a cross sectional view illustrating a second disclosed embodiment of a sub-mount according to one aspect of the invention.
Figure 3:
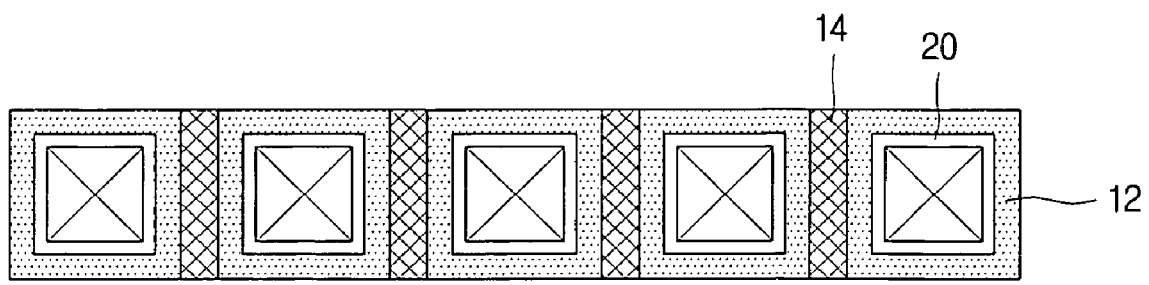
FIG. 3 is a plan view illustrating the second disclosed embodiment of a sub-mount according to one aspect of the invention.

FIG. 1 is a cross sectional view illustrating a first disclosed embodiment of a sub-mount according to one aspect of the invention, FIG. 2 is a cross sectional view illustrating a second disclosed embodiment of a sub-mount according to one aspect of the invention, and FIG. 3 is a plan view illustrating the second disclosed embodiment of a sub-mount according to one aspect of the invention. In FIGS. 1 to 3, there are illustrated metal bodies 12, oxide walls 14, an oxide layer 16, and light emitting diodes 20.

The structure of a sub-mount according to this embodiment may include a multiple number of metal bodies 12, to which a multiple number of light emitting diodes 20 may be respectively mounted, where these metal bodies 12 may be electrically disconnected, i.e. insulated, by oxide walls 14. Each of the metal bodies 12 may support each other by way of the oxide walls 14, allowing for easy handling during the manufacturing process.

In consideration of efficient heat release, as well as of economic viability, the sub-mount based on this particular embodiment can be made mainly of aluminum. Then, portions of an aluminum plate can be oxidized, using an anodizing method, for example, to form the oxide walls 14, and thus form the multiple number of metal bodies 12 that are insulated from one another. In this way, metal bodies 12 of an aluminum material and oxide walls 14 of an aluminum oxide material can be provided.

If an insulation layer is desired also on the lower surface of the sub-mount, an oxide layer 16 may be formed on the lower surface of the metal bodies 12 and oxide walls 14, as illustrated in FIG. 2. For example, after oxidizing portions of an aluminum plate to form the oxide walls 14 as described above, the lower surface of the aluminum plate may also be oxidized to form the oxide layer 16. By virtue of this structure, when a sub-mount according to this embodiment is mounted on a substrate 30, any unintended connection between the upper surface of the substrate 30 and the lower surface of the sub-mount can be prevented.

A description has been provided above on certain embodiments of the sub-mount, according to an aspect of the invention. A description will now be provided as follows on a light emitting diode package equipped with a sub-mount described above, with reference to FIGS. 4 and 5.

Figure 4:
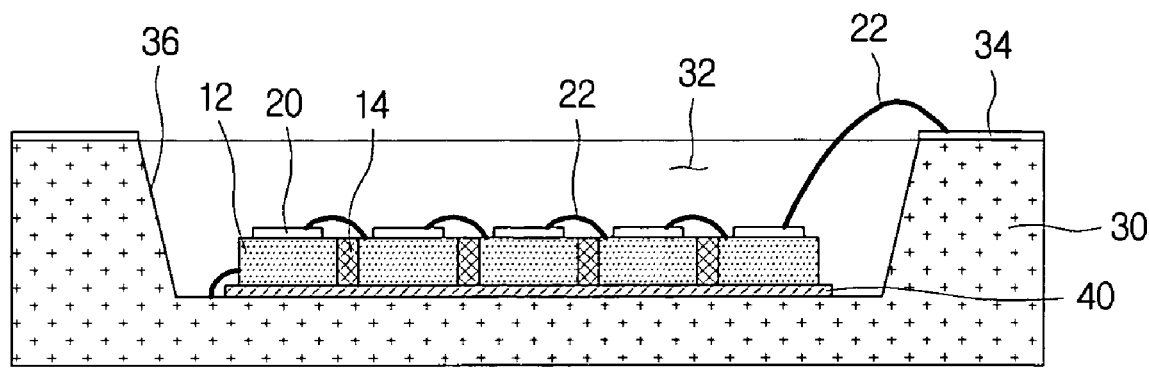
FIG. 4 is a cross sectional view illustrating a light emitting diode package according to another aspect of the invention.
Figure 5:
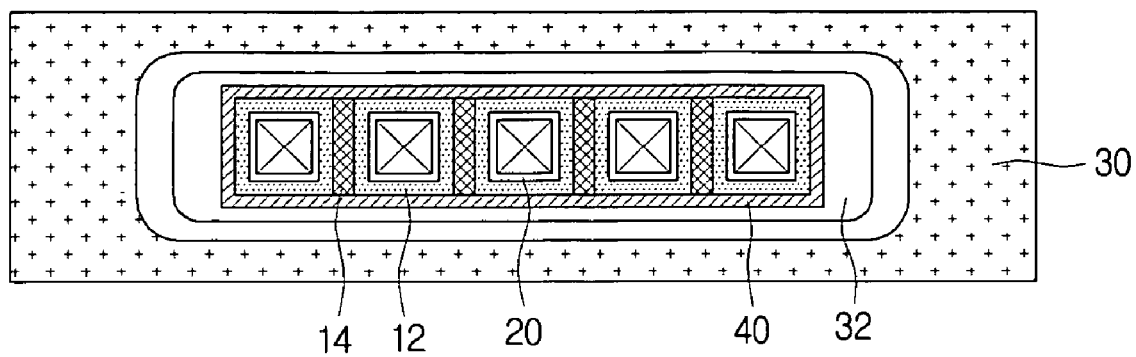
FIG. 5 is a plan view illustrating a light emitting diode package according to another aspect of the invention.

FIG. 4 is a cross sectional view illustrating a light emitting diode package according to another aspect of the invention, and FIG. 5 is a plan view illustrating a light emitting diode package according to another aspect of the invention. In FIGS. 4 and 5, there are illustrated metal bodies 12, oxide walls 14, light emitting diodes 20, wires 22, a substrate 30, a cavity 32, an electrode 34, reflective surfaces 36, and an adhesion layer 40.

A light emitting diode package according to this embodiment can be structured to have a light emitting diode 20 mounted on each of the metal bodies 12 of a sub-mount such as that described above, with this sub-mount mounted by way of an adhesion layer 40, etc., on a substrate 30, in which a cavity 32 having reflective surfaces 36 is formed.

As described above, the structure of the sub-mount mounted inside the cavity 32 can include a multiple number of metal bodies 12 on which a multiple number of light emitting diodes 20 are mounted, respectively, where the metal bodies 12 can be electrically disconnected, i.e. insulated, from one another by oxide walls 14. In consideration of efficient heat release and economic viability, the sub-mount according to this embodiment can be made mainly of aluminum, as already described above.

On the upper surface of each metal body 12, a light emitting diode 20 can be mounted. The heat generated by the operation of the light emitting diodes 20 may be efficiently dispersed through the metal bodies 12 located below the light emitting diodes 20, and the oxide walls 14 that electrically disconnect each of the metal bodies 12 may also be more thermally conductive compared to typical insulators made from polymer materials, so that efficient heat dissipation may be obtained over the entire sub-mount.

In the case where either the anode or the cathode of a light emitting diode 20 is formed on the lower surface, the anode or cathode can be placed in direct contact with the metal body 12, whereby the metal body 12 may serve as both an electrical and a thermal channel.

That is, as in the example shown in FIG. 4, in the case where one of the anode and cathode of each of the light emitting diodes 20 is formed on the lower surface and the other of the anode and cathode is formed on the upper surface, an electrical connection may be implemented by wire bonding between the upper surface of a light emitting diode 20 and an adjacent metal body 12, and if an electrode is formed on the lower surface of the cavity 32, a metal body 12 may also be connected with the electrode on the lower surface of the cavity 32. However, this electrical connection structure is presented merely as an example, and it is to be appreciated that the electrical connection may be implemented in a variety of structures in accordance with the arrangement of anodes and cathodes in the light emitting diodes 20.

Reflective surfaces 36 can be formed on the sides of the cavity 32 to maximize the light collection efficiency for the light from the light emitting diodes 20. Although it is not illustrated in the drawings, a transparent molding resin, etc., can be filled in the cavity 32 and shaped into the form of a spherical lens. In addition, slits may be formed in the resin, shaped in a particular pattern.

While FIG. 4 illustrates a light emitting diode package equipped with a sub-mount based on the first disclosed embodiment of the invention described above, it is to be appreciated that a sub-mount based on the second disclosed embodiment may also be employed.

Figure 6:
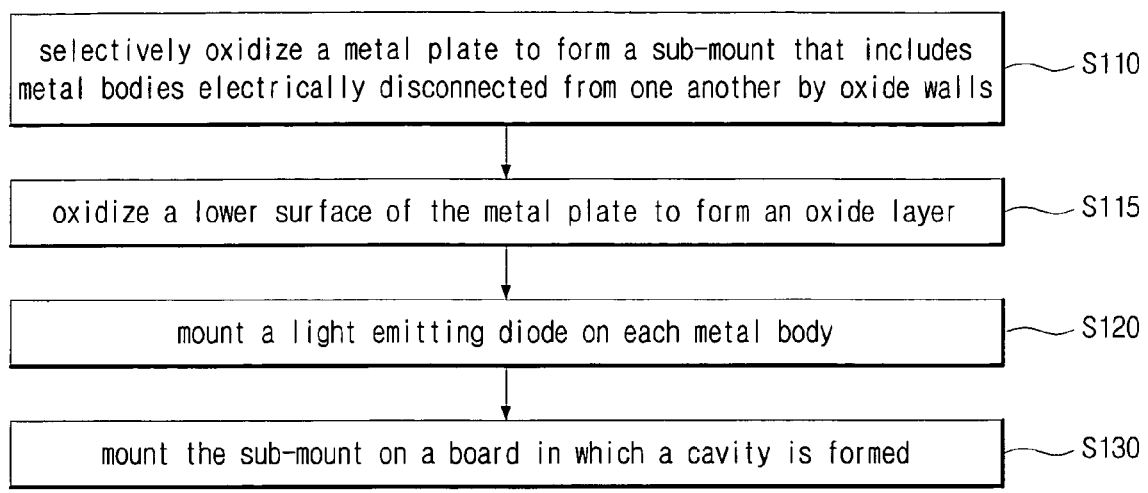
FIG. 6 is a flowchart illustrating a method of manufacturing a light emitting diode package according to yet another aspect of the invention.

Next, a description will be provided as follows on a method of manufacturing a light emitting diode package according to yet another aspect of the invention, with reference to FIGS. 6 to 10. FIG. 6 is a flowchart illustrating a method of manufacturing a light emitting diode package according to yet another aspect of the invention, while FIG. 7 through FIG. 10 are drawings representing a flow diagram for the method of manufacturing a light emitting diode package illustrated in FIG. 6. In FIGS. 7 to 10, there are illustrated a metal plate 10, metal bodies 12, oxide walls 14, light emitting diodes 20, wires 22, a substrate 30, a cavity 32, an electrode 34, reflective surfaces 36, and an adhesion layer 40.

Figure 7:
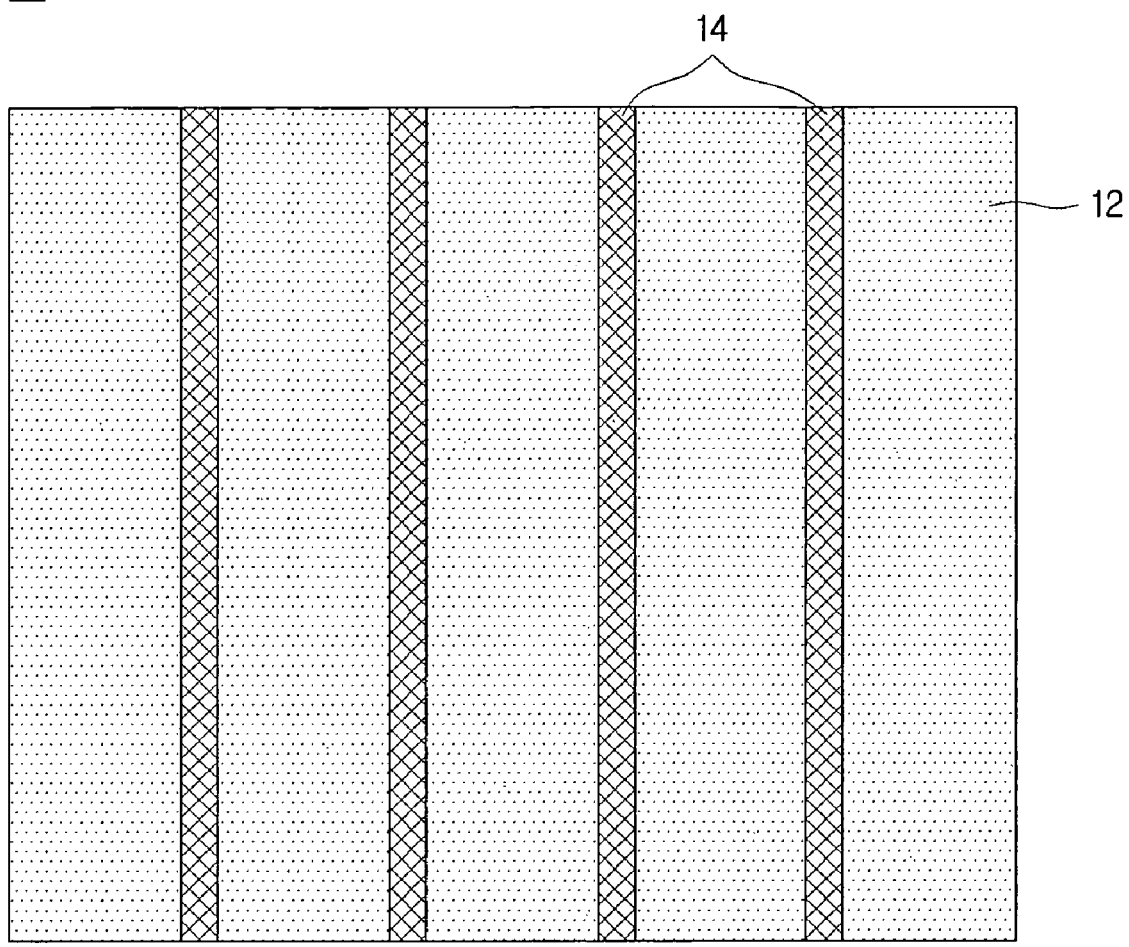
FIG. 7, FIG. 8, FIG. 9, and FIG. 10 are drawings representing a flow diagram for the method of manufacturing a light emitting diode package illustrated in FIG. 6.

First, as illustrated in FIG. 7, a metal plate 10 can be selectively oxidized, to form a sub-mount that includes multiple metal bodies 12 electrically disconnected from one another by oxide walls 14 (S110). In consideration of efficient heat release and economic viability, the metal plate 10 can be made with aluminum as its major component. Then, portions of an aluminum plate can be oxidized such that the oxide walls 14 are formed, whereby a multiple number of insulated metal bodies 12 may be formed. In this way, metal bodies 12 made from an aluminum material and oxide walls 14 made from an aluminum oxide material can be obtained.

Figure 8:
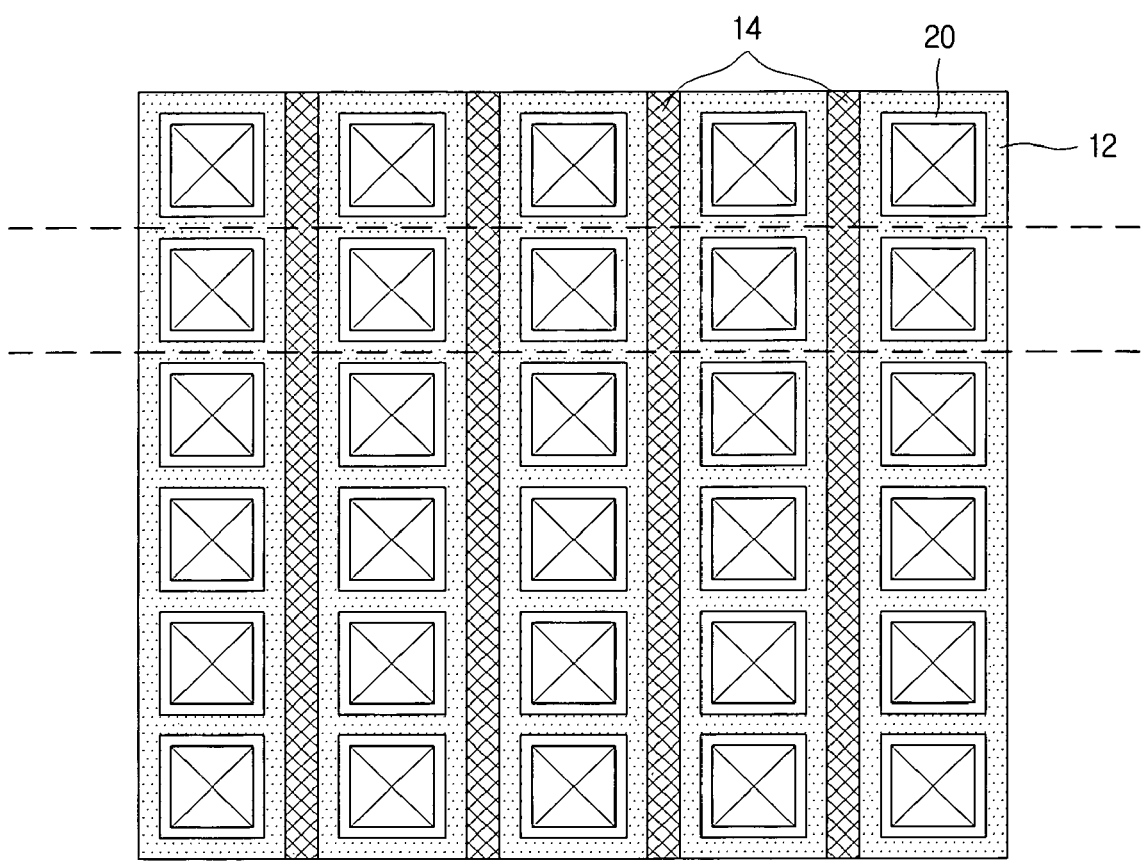

In the case where several sub-mounts are to be formed at the same time, the manufacturing method may include forming the oxide walls 14 along longitudinal directions in the metal plate 10, as illustrated in FIG. 7, and then cutting the metal plate 10 along lateral directions, as illustrated in FIG. 8. The lateral dotted lines illustrated in FIG. 8 represent an example set of cutting lines.

In the case where an insulation layer is to be formed also on the lower surface of the sub-mount, the lower surface of the metal plate 10 can be oxidized to form an oxide layer 16 (S115), as in the example illustrated in FIG. 2. By forming an oxide layer 16 also on the lower surface of the metal plate 10, any unintended connection between the upper surface of the substrate 30 and the lower surface of the sub-mount can be prevented.

After forming the sub-mount using the method described above, a light emitting diode 20 can be mounted on each of the metal bodies 12 (S120). An example of a configuration after mounting the light emitting diodes 20 respectively on the metal bodies 12 is illustrated in FIG. 8. In the case where several sub-mounts are to be formed at the same time, as described above, it is possible to employ a method of mounting the light emitting diodes 20 on the metal plate 10, and afterwards cutting the metal plate 10 in lateral directions.

As already described above, in the case where either the anode or cathode of each of the light emitting diodes 20 is formed on the lower surface, the anode or cathode formed on the lower surface can be placed in direct contact with the metal body 12, allowing the metal body 12 to serve as both an electrical and a thermal channel.

Figure 9:
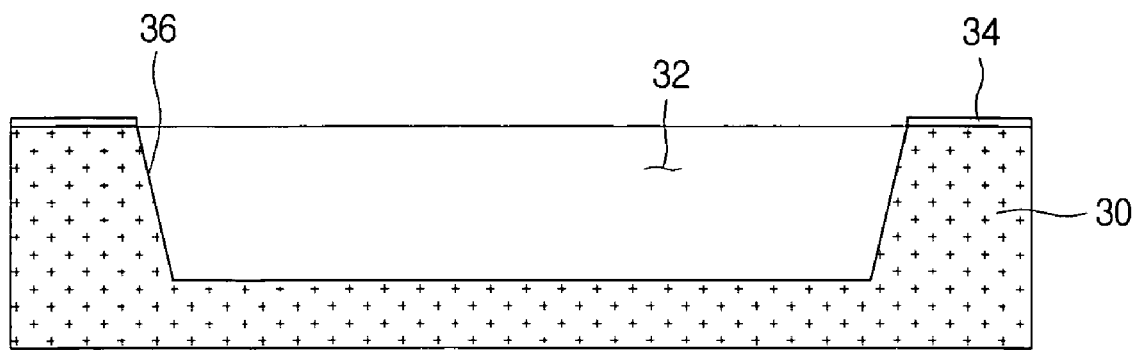
Figure 10:
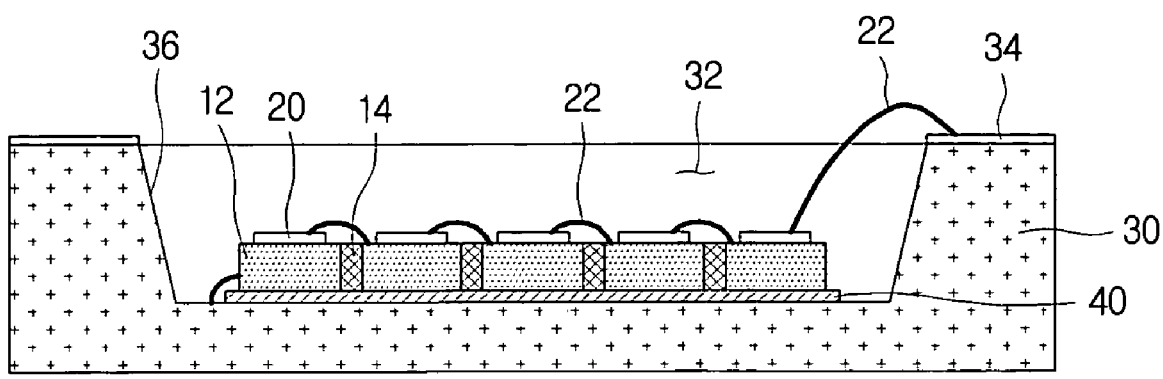

Afterwards, the sub-mount can be mounted on a substrate 30, in which a cavity 32 is formed (S130). In other words, the sub-mount, on which the light emitting diodes 20 are mounted, can itself be mounted inside the cavity 32, as illustrated in FIGS. 9 and 10. Reflective surfaces 36 can be formed on the sides of the cavity 32, to maximize the light collection efficiency for the light from the light emitting diodes 20. FIG. 10 illustrates an example in which the sub-mount is mounted by way of an adhesion layer 40, but it is to be appreciated that any of various other methods may also be employed.

After mounting the sub-mount in the substrate 30, an electrical connection can be implemented, using wires 22, etc., between the electrode and the light emitting diodes 20. Although it is not illustrated in the drawings, a transparent molding resin, etc., can be filled in the cavity 32 and shaped into the form of a spherical lens. In addition, slits may be formed in the resin, shaped in a particular pattern.

According to certain aspects of the invention as set forth above, by selectively oxidizing a metal to form a sub-mount that having multiple light emitting diodes mounted thereon, a high heat releasing effect may be obtained, and manufacturing costs may be reduced.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above can be found in the appended claims.

What is claimed is:

1. A sub-mount, the sub-mount comprising:
   a plurality of metal bodies arranged in one direction;
   an oxide wall interposed between the metal bodies such that adjacent ones of the metal bodies are supported by each other and electrically disconnected from each other; and
   a plurality of light emitting diodes disposed on surfaces of respective ones of the plurality of metal bodies, each of the plurality of light emitting diodes electrically contacting the respective surface of the metal body on which the respective light emitting diode is disposed.

2. The sub-mount of claim 1, wherein
   the metal body is made from a material containing aluminum, and
   the oxide wall is made from a material containing aluminum oxide.

3. The sub-mount of claim 1, further comprising:
   an oxide layer formed on a lower surface of the plurality of metal bodies and the oxide wall.

4. A light emitting diode package, the light emitting diode package comprising:
   a substrate having a cavity formed therein; and
   a sub-mount inset in the cavity;
   wherein the sub-mount comprises:
   a plurality of metal bodies arranged in one direction;
   an oxide wall interposed between the metal bodies such that adjacent ones of the metal bodies are supported by each other and electrically disconnected from each other; and
   a plurality of light emitting diodes disposed on surfaces of respective ones of the plurality of metal bodies, each of the plurality of light emitting diodes electrically contacting the respective surface of the metal body on which the respective light emitting diode is disposed.

5. The light emitting diode package of claim 4, wherein
   the metal body is made from a material containing aluminum, and
   the oxide wall is made from a material containing aluminum oxide.

6. The light emitting diode package of claim 4, further comprising:
   an oxide layer formed on a lower surface of the plurality of metal bodies and the oxide wall.

7. The light emitting diode package of claim 4, wherein the light emitting diode has one of a cathode and an anode contacting the metal body.

* * * * *